United States Patent [19]
Siniscalchi et al.

[11] Patent Number: 5,399,994

[45] Date of Patent: Mar. 21, 1995

[54] PROGRAMMABLE VOLTAGE-CONTROLLED OSCILLATOR HAVING CONTROL CURRENT GENERATING AND COMPENSATING CIRCUITS

[75] Inventors: Patrick P. Siniscalchi, Sachse; William R. Krenik, Garland, both of Tex.

[73] Assignee: Texas Instruments Incorporated, Dallas, Tex.

[21] Appl. No.: 129,713

[22] Filed: Sep. 30, 1993

[51] Int. Cl.$^6$ .................. H03K 3/03; H03L 1/00; H03L 7/099

[52] U.S. Cl. .................... 331/17; 331/34; 331/113 R; 331/143; 331/177 R; 331/DIG. 3

[58] Field of Search ............ 331/17, 34, 113 R, 143, 331/177 R, DIG. 3

[56] References Cited

U.S. PATENT DOCUMENTS 5,144,156  9/1992  Kawasaki ................ 331/17 X
5,302,919  4/1994  Abe ......................... 331/17 X

*Primary Examiner*—Siegfried H. Grimm
*Attorney, Agent, or Firm*—Robby T. Holland; Wade James Brady, II; Richard L. Donaldson

[57] ABSTRACT

A programmable VCO circuit (300, 700) and method of use are provided whereby a current proportional to the strength of the NMOS process used to fabricate the circuit may be subtracted from the control current derived at the circuit's input, to compensate for process variations. Also, a programmable VCO circuit (300) and method of use are provided whereby a current developed from one-half the supply voltage for the VCO circuit may be subtracted from the control current derived at the circuit's input, in order to cause programmed gain changes to occur about the center of the control voltage range, and minimize output "jitter" when the VCO is used in a phase-locked loop. A gain compensation circuit (800) is also provided to linearize the gain of the programmable VCO circuit (300) for higher control voltage levels and thereby extend the VCO's effective operating range.

6 Claims, 3 Drawing Sheets

PROGRAMMABLE VOLTAGE-CONTROLLED OSCILLATOR HAVING CONTROL CURRENT GENERATING AND COMPENSATING CIRCUITS

TECHNICAL FIELD OF THE INVENTION

This invention relates generally to electronic circuits, and more particularly, to programmable voltage-controlled oscillator circuits.

BACKGROUND OF THE INVENTION

Voltage-controlled oscillators (VCOs) may be used in many applications where a stable, high frequency signal is required. For example, a VCO may be used as part of a phase-locked loop in a frequency synthesizer to provide a plurality of discrete, high resolution clock signals at high frequencies (e.g., in the 10 Mhz–110 Mhz range). In a typical application, these signals may be applied to the clock inputs of integrated circuit (IC) chips in a particular system to synchronize their operations.

FIG. 1 illustrates a typical IC VCO core circuit, which may use pseudo-NMOS NOR gates configured as latches to develop an output signal Vco. The frequency of the output signal Vco from VCO core circuit 10 may be determined by the magnitude of the input drive current $I_{core}$. However, a significant problem in manufacturing integrated circuit VCOs using NMOS gates, for example, is that the frequency ranges of the VCO circuits are highly process-dependent. In other words, the "strength" of the NMOS process used to fabricate each VCO IC significantly affects the frequency range of the device.

For example, if the NMOS process used to fabricate the n-channel gates in VCO core circuit 10 was relatively "weak", less n-channel current, $I_{NCH}$, will flow in the core. Consequently, signal propagation time through the gates of VCO 10 will be increased, thus decreasing the overall speed of the device. Conversely, if the NMOS fabrication process for VCO circuit 10 was relatively "strong", then the propagation time through the NOR gates would be decreased, thus increasing the speed of the device. FIG. 2 illustrates the frequency variations between typical VCO integrated circuits due to variations in the "strengths" of their respective fabrication processes. Generally, the fabrication processes for these integrated circuits and, therefore, the "strengths" of their n-channel structures, vary from wafer lot to wafer lot.

Generally, to compensate for process variations such as those illustrated by FIG. 2, VCO IC designers may increase the gain (to increase $I_{core}$) of individual VCO circuits for relatively "weak" n-channel devices, or decrease the gain (to decrease $I_{core}$) of "strong" individual VCOs. Nevertheless, in order to provide a wide range of frequencies with a "weak" VCO, the VCO's gain must be made large enough for the device to produce the highest frequencies in the range, which typically creates a significant design problem in applications that use such a VCO.

FIG. 3 is a block diagram illustrating a phase-locked loop (PLL) circuit including VCO core circuit 10 shown in FIG. 1. PLL circuit 100 may represent a typical design. If the n-channel structure of VCO core circuit 10 is very "weak", then the minimum gain required for VCO core circuit 10 to provide the highest frequencies in a desired range may be relatively high, which will result in a related problem whereby excessive "jitter" may be created at the output of the PLL circuit.

In designing phase-locked loops with a typical VCO, such as core circuit 10, another problem typically arises. In order to counteract open loop gain changes caused by changes in the value of the loop divider, M, the VCO's gain may be controlled by the loop divider, M, as shown in FIG. 3, so as to track those changes. However, as illustrated by FIG. 4, the slope of each gain curve for a respective value of M is controlled from the lowest end-point of the curve (starting at $V_{VCO}$). Consequently, the frequency range for the lower values of VCO control voltage (e.g., $V_1$) is very limited for changes in M, in comparison with the higher control voltages (e.g., $V_2$).

SUMMARY OF THE INVENTION

Accordingly, a need exists in the integrated circuit manufacturing industry for a process-independent, VCO integrated circuit. Additionally, a need exists for a programmable VCO circuit that may be used, for example, with a PLL circuit, whereby the VCO has a broader frequency range at the lower control voltages, with respect to changes in the loop divider's value, and also minimizes "jitter" at the output of the PLL. In accordance with the present invention, a programmable VCO circuit and method of use are provided whereby a current proportional to the "strength" of the NMOS process used to fabricate the circuit may be subtracted from the control current derived at the circuit's input, to compensate for process variations. Also, a programmable VCO circuit and method of use are provided whereby a current derived from one-half the supply voltage for the VCO circuit may be subtracted from the control current derived at the circuit's input, in order to cause programmed gain changes to occur about the center of the control voltage range, and minimize output "jitter" when the VCO is used in a PLL. A gain compensation circuit is also provided to linearize the gain of the programmable VCO circuit for higher control voltage levels and thereby extend the VCO's effective operating range.

An important technical advantage of the present invention is that a process-independent, VCO integrated circuit may be fabricated. Another important technical advantage of the present invention is that a VCO may be used in a PLL, whereby the VCO has a broader frequency range at the "centered" control voltages and also minimizes "jitter" at the output of the PLL.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–9 of the drawings, like numerals being used for like and corresponding parts of the various drawings.

Figure 5:
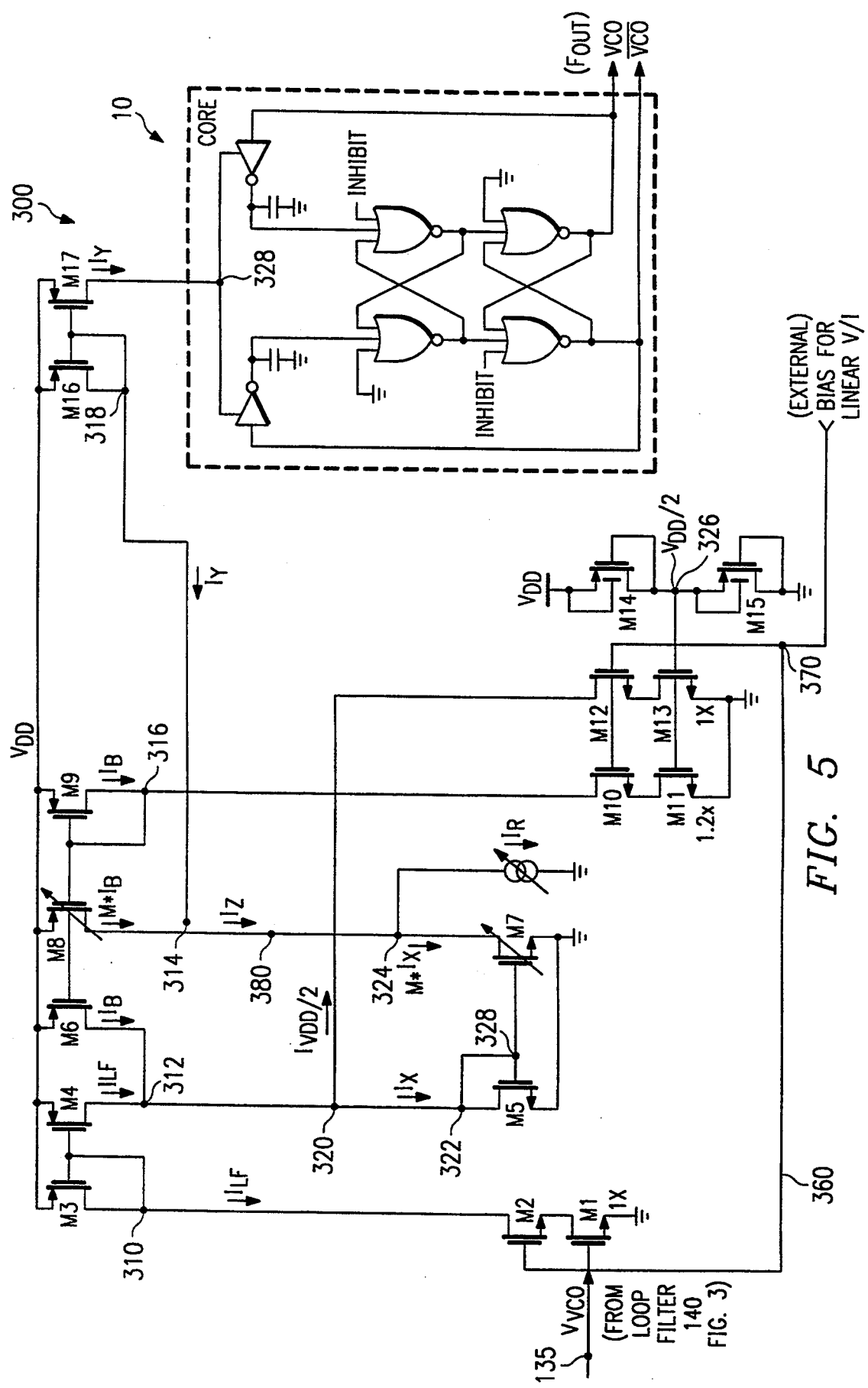
FIG. 5 illustrates an electrical schematic circuit diagram of a preferred embodiment of a VCO circuit according to the teachings of the present invention.

FIG. 5 illustrates a preferred embodiment of a VCO circuit according to the teachings of the present invention. VCO circuit 300 may include VCO core circuit 10 which, for example, may use pseudo-NMOS NOR gates arranged as latches to generate an output signal Vco. For use in a phase-locked loop, such as phase-locked loop circuit 100 shown in FIG. 3, VCO circuit 300 may be combined with VCO core circuit 10, and the combination may be substituted for VCO core circuit 10 in FIG. 3. Generally, VCO circuit 300 may include circuitry, which will be described in detail below, in which a current developed from one-half of the supply voltage, $V_{DD}$, may be subtracted from the input current derived from the control voltage for the VCO (i.e., $V_{VCO}$ from node 135 in FIG. 3).

Specifically, referring to FIG. 5, control voltage $V_{VCO}$ is coupled to the gate of transistor M1. In a preferred embodiment, transistors M1–M17 may be fabricated as MOSFETs on a single integrated circuit chip. However, the invention is not intended to be so limited. Any appropriate device having the functional capabilities of transistors M1–M17 may be substituted in VCO circuit 300. Also, the invention is not intended to be limited solely to circuitry contained on a single integrated circuit chip and may constitute a plurality of integrated circuits.

Figure 1:
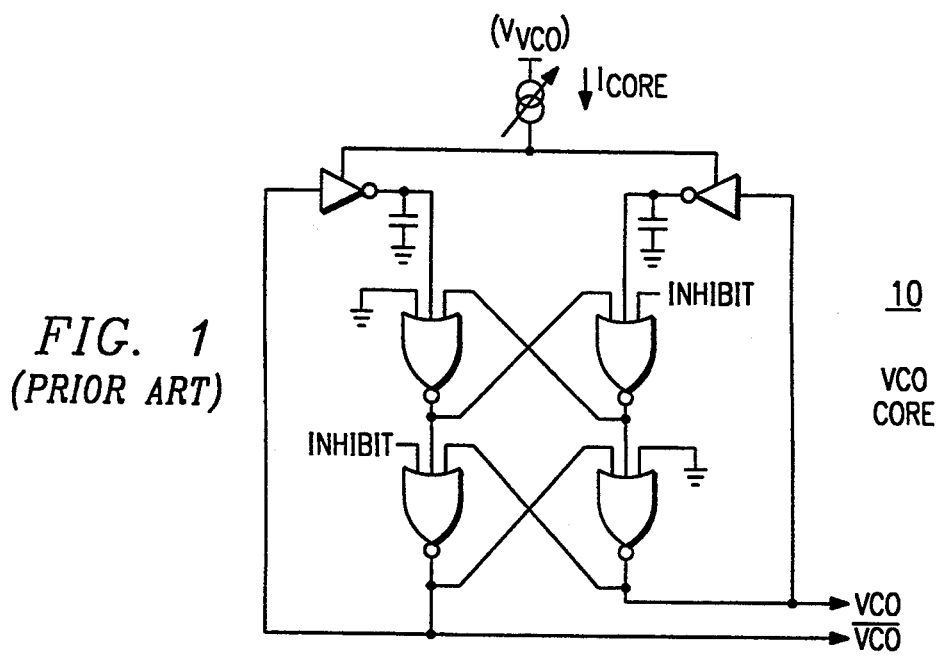
FIG. 1 illustrates an electrical schematic diagram of a typical VCO core circuit.
Figure 2:
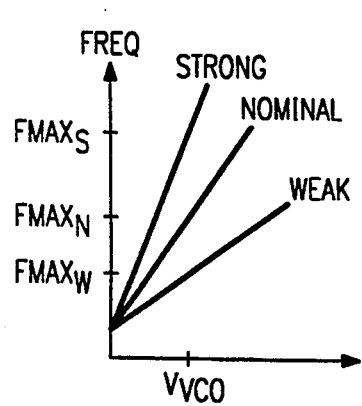
FIG. 2 illustrates representative gain curves for the VCO core circuit shown in FIG. 1.
Figure 4:
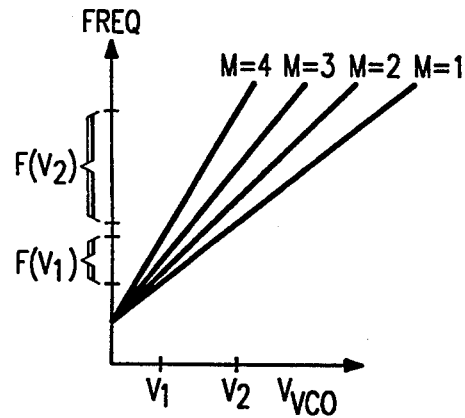
FIG. 4 illustrates representative gain curves for the VCO circuit shown in FIG. 3.
Figure 3:
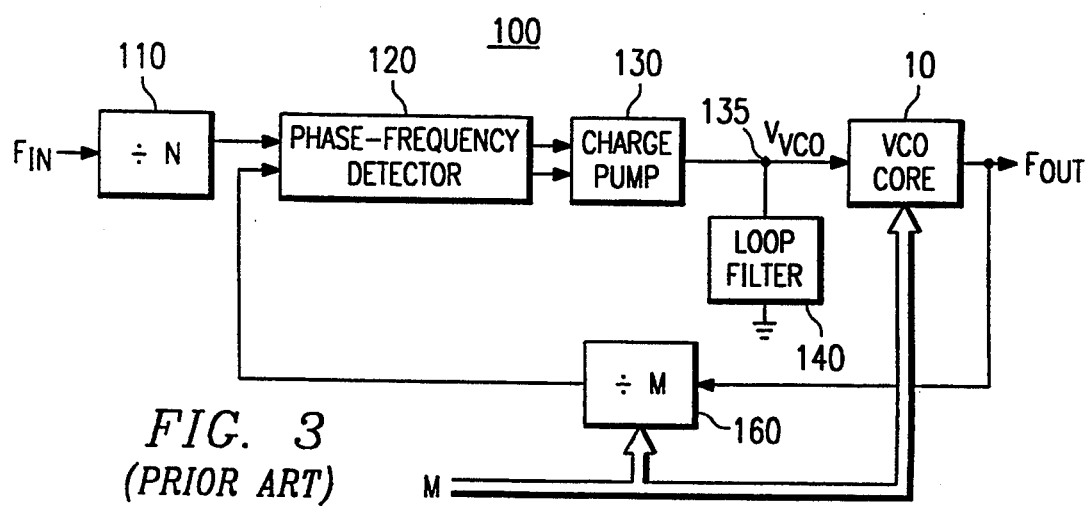
FIG. 3 illustrates a schematic block diagram of a phase-locked loop circuit including a VCO core circuit.

The source of transistor M1 is connected to circuit "ground", and the drain of M1 is connected to the source of transistor M2. The drain of transistor M2 is connected to node 310. Current $I_{LF}$ represents the control current derived from the control voltage $V_{VCO}$ input from loop filter 140 (FIG. 3). The gate of M2 is connected via line 360 to node 370. Node 310 is connected to the drain and gate of transistor M3, and also to the gate of M4. The source of M3 is connected to supply voltage $V_{DD}$. The drain of M4 is connected to node 312, and the source of M4 is connected to $V_{DD}$.

Transistors M3 and M4 are arranged as a "current mirror" so that current $I_{LF}$ flows equally through each half of the "mirror". Node 312 is connected to node 320 and the drain of transistor M6. The source of M6 is connected to $V_{DD}$. The gate of M6 is connected to the gate of transistor M8, which is further connected to the gate of M9. The drain of M8 is connected to node 314. The gate of M9 is connected to node 316 and the drain of M9. The sources of transistors M8 and M9 are connected to $V_{DD}$.

Transistors M6 and M9 are arranged so that a current represented as $I_B$ flows equally through both transistors. Transistor M8 may be configured similar to transistors M6 and M9 to provide a current $I_B$. However, transistor M8 is constructed preferably of multiple semiconductor devices, which may be selectively inserted or removed by transmission gates (not explicitly shown) as desired. Consequently, current $I_B$ through M8 may be modified by values of M, a PLL divider word, to provide the current represented as $M*I_B$. Node 314 is connected to nodes 318 and 324. The current represented as $I_Y$ flows between nodes 318 and 314, and the current represented as $I_Z$ flows between 314 and 324. Node 316 is connected to the drain of transistor M10.

Node 318 is connected to the gate and drain of transistor M16, and the gate of M16 is further connected to the gate of transistor M17. The sources of M16 and M17 are connected to $V_{DD}$, and the drain of M17 is connected to input connection 328 of VCO core circuit 10. Transistors M16 and M17 are arranged as a current mirror so that current $I_Y$ flows equally through each transistor. Current $I_Y$ flowing through node 328 provides the drive current for VCO core 10.

Node 320 is connected to node 322 and the drain of transistor M12. The current, $I_{VDD/2}$, which is shown flowing between node 320 and transistor M12, represents the above-mentioned current derived from one-half of the supply voltage for VCO circuit 300. Consequently, as described below, the present invention may be structured to operate VCO core circuit 10 at the midpoint of the core circuit's gain curve, by developing a drive current $I_Y$ that is equal to $I_{LF}$ (the control current) minus $I_{VDD/2}$.

Node 322 is connected to node 328 and the drain of transistor M5. Node 328 is connected to the gates of transistors M5 and M7. The sources of M5 and M7 are connected to circuit ground. Transistors M5 and M7 are arranged as a current mirror so that the current represented as $I_X$ may flow equally through each half of the mirror. However, similar to the structure of transistor M8, transistor M7 may be constructed of multiple semiconductor devices, which may be selectively inserted or removed by transmission gates (not explicitly shown) as desired, so that the current $I_X$ flowing through M7 may be modified by values of M, the PLL divider word, to produce the current represented as $M*I_X$.

Node 324 is connected to the drain of transistor M7 and the output connection of current source $I_R$. The opposite connection of source $I_R$ is connected to ground. Current source $I_R$ is a variable current source, which as described in detail below, may be added at node 324 to broaden the frequency range of VCO circuit 300 and, therefore, reduce the gain of the VCO at the higher frequencies. The gates of transistors M10 and M12 are connected together and also to node 370. A bias voltage may be applied from an external source (not explicitly shown) to node 370 and also to the gate of transistor M2, in order to keep M1 conducting in "triode". Consequently, the bias voltage functions to convert the control voltage, $V_{VCO}$, linearly to an associated control current, $I_{LF}$. The sources of transistors M10 and M12 are connected to the drains of respective transistors M11 and M13, and the sources of transistors M11 and M13 are connected to ground. The gates of transistors M11 and M13 are connected together and also to node 326. Node 326 is connected to the drain and one gate of transistor M14, and also to the source and back gate of M15. The source of M14 is connected to the back gate of M14 and also to $V_{DD}$. The drain of transistor M15 is connected to its gate and also to ground. By matching the characteristics of transistors M14 and M15, one half of the supply voltage (i.e., $V_{DD}/2$) may be developed at node 326.

In accordance with the present invention, the operation of VCO circuit 300 may be described in terms of the following equations:

$$I_X = I_{LF} + I_B - I_{VDD/2} \quad (1)$$

$$I_Y = I_Z - M^*I_B \quad (2)$$

$$I_Z = M^*I_X + I_R = M^*(I_B + I_{LF} - I_{VDD/2}) + I_R \quad (3)$$

$$I_Y = M^*(I_{LF} - I_{VDD/2}) + I_R \quad (4)$$

Essentially, transistor M6 operates to add current $I_B$ to the control current $I_{LF}$ at node 312. Consequently, if $I_{VDD/2} > I_{LF}$ (i.e., the current derived from one half of the supply voltage is ever greater than the control current), transistor M5 may still conduct and, therefore, continue to produce current $I_X$. As described above, transistors M7 and M8 may be structured as multiple-component devices, which may be selectively inserted or removed by transmission gates (not explicitly shown), thereby facilitating control of transistors M7 and M8 by the value of a PLL divider word, M. Consequently, the gains of transistors M7 and M8 may be modified according to the values of M.

Transistors M5 and M7 may be structured to form a current mirror and, consequently, produce current $M^*I_X$ (i.e., $I_X$ modified by the value of M) flowing through the M7 half of the mirror. However, since current $I_B$ forms a portion of current $I_X$ flowing through the M5 half of the mirror, transistor M8 functions to add a current $M^*I_B$, which forms a portion of current $M^*I_X$ flowing through transistor M7, in order to cancel current $I_B$ flowing in the mirror. The value of $I_B$ is always maintained slightly larger than the value of $I_{VDD/2}$, so that if $I_{LF}$ ever equals zero, then $I_X$ will not also equal zero.

Figure 6:
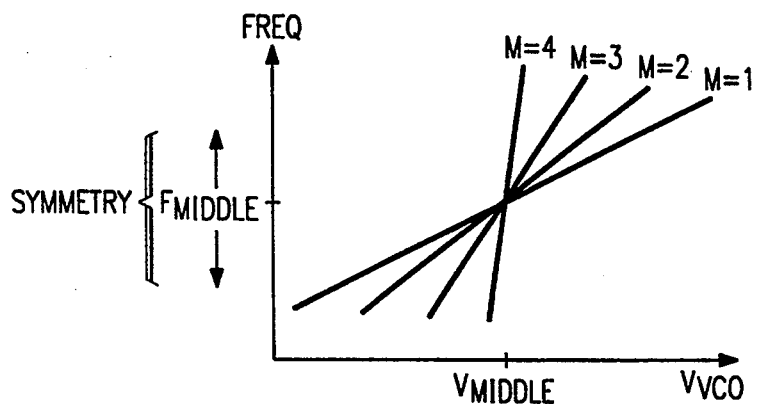
FIG. 6 illustrates representative gain curves for the VCO circuit shown in FIG. 5.

In summary, as demonstrated by equation 4 above, the drive current $I_Y$ for core 10 of VCO 300 may be derived from a product of the gain modifier (M) times the control current ($I_{LF}$) derived from the control voltage ($V_{VCO}$), minus the current derived from one half of the supply voltage ($I_{VDD/2}$), plus the value of the variable current source ($I_R$). A function described by equation 4 is illustrated in FIG. 6, which shows how the frequency response of VCO circuit 300 changes in response to changes of a gain modifier, M. More importantly, however, FIG. 6 demonstrates that the slope of a gain curve from VCO circuit 300 may be controlled at the midpoint of the curve, rather than at the lower endpoint (as described above with respect to FIG. 4). Consequently, the frequency range of VCO circuit 300 may be significantly broadened at the lower control voltages. Furthermore, in accordance with the present invention, VCO circuit 300 may be operated with lower gain requirements compared to typical VCO circuits, in order to reduce excessive "jitter" when used in a phase-locked loop circuit. Moreover, VCO circuit 300 may provide symmetrical range programmability, whereby the control voltage, $V_{VCO}$, would not have to be skewed to either supply rail in order to produce the highest or lowest frequencies within a particular range.

As discussed above, VCO core circuit 10 (FIG. 1) may include a plurality of NMOS gates or other devices. Consequently, the processing speed of VCO core circuit 10 may be affected substantially by the "strength" of the NMOS fabrication process. In order to correct such a problem, either a current that is inversely proportional to the "strength" of the NMOS process (e.g., inversely proportional to the n-channel current, $I_{NCH}$) may be added to drive current $I_{core}$ in VCO core circuit 10, or a current that is proportional to the "strength" of the process may be subtracted. The latter concept may be implemented in the present VCO circuit by sourcing an n-channel process current, $I_{NCH}$, directly into current $I_Z$ in VCO circuit 300 of FIG. 5.

Figure 7:
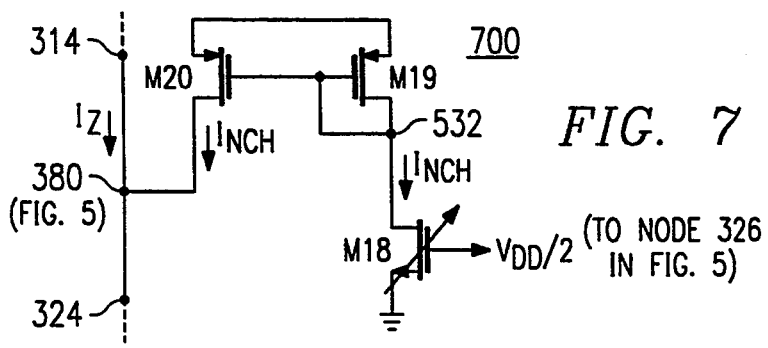
FIG. 7 illustrates an electrical schematic circuit diagram of a second embodiment of a VCO circuit according to the teachings of the present invention.

Specifically, FIG. 7 illustrates a second embodiment of a VCO circuit according to the teachings of the present invention. Process-compensation circuit 700 in FIG. 7 may be incorporated directly into VCO circuit 300 of FIG. 5. Essentially, transistors M19 and M20 may be arranged to form a current mirror. The drain of transistor M20 is connected to node 380 (FIG. 5). The source of transistor M20 is connected to the source of transistor M19. The gates of transistors M19 and M20 are connected together and also to node 532. Node 532 is connected to the drain of transistor M18, and the source of M18 is connected to ground. The gate of M18 is connected to node 326 (FIG. 5). Consequently, an n-channel current, $I_{NCH}$, which is dependent on the "strength" of the NMOS fabrication process, may be sourced into current $I_Z$ and also into current $I_{VDD/2}$.

The resulting currents now flowing in the combined circuitry of FIGS. 5 and 7 may be described by the following equations:

$$I_Y = I_Z - M^*I_B - I_{NCH} \quad (5)$$

$$I_Z = I_R + M^*(I_B + I_{LF} + I_{VDD/2}) \quad (6)$$

$$I_Y = I_R - I_{NCH} + M^*(I_{LF} - I_{VDD/2}) \quad (7)$$

In order to make the ($I_R - I_{NCH}$) difference fairly constant as $I_R$ is programmed through different ranges, transistor M18 may be structured of multiple devices, which may be inserted or removed selectively by transmission gates (not explicitly shown). Consequently, the gain of transistor M18 may be adjusted with the same digital word used to adjust current source $I_R$. In accordance with the present invention, equation 7 demonstrates that when $I_{NCH}$ is increased (e.g., the NMOS transistors in VCO core circuit 10 are "stronger" than a nominal value), then drive current $I_Y$ into VCO core circuit 10 may be reduced. Conversely, when the NMOS transistors in VCO core circuit 10 are "weaker" than the nominal value (e.g., $I_{NCH}$ is decreased), then the drive current $I_Y$ may be increased. In other words, the present invention compensates for n-channel process variations in a VCO core circuit by increasing the input drive current when the NMOS devices are "weak", and decreasing the drive current for "strong" devices.

Figure 8:
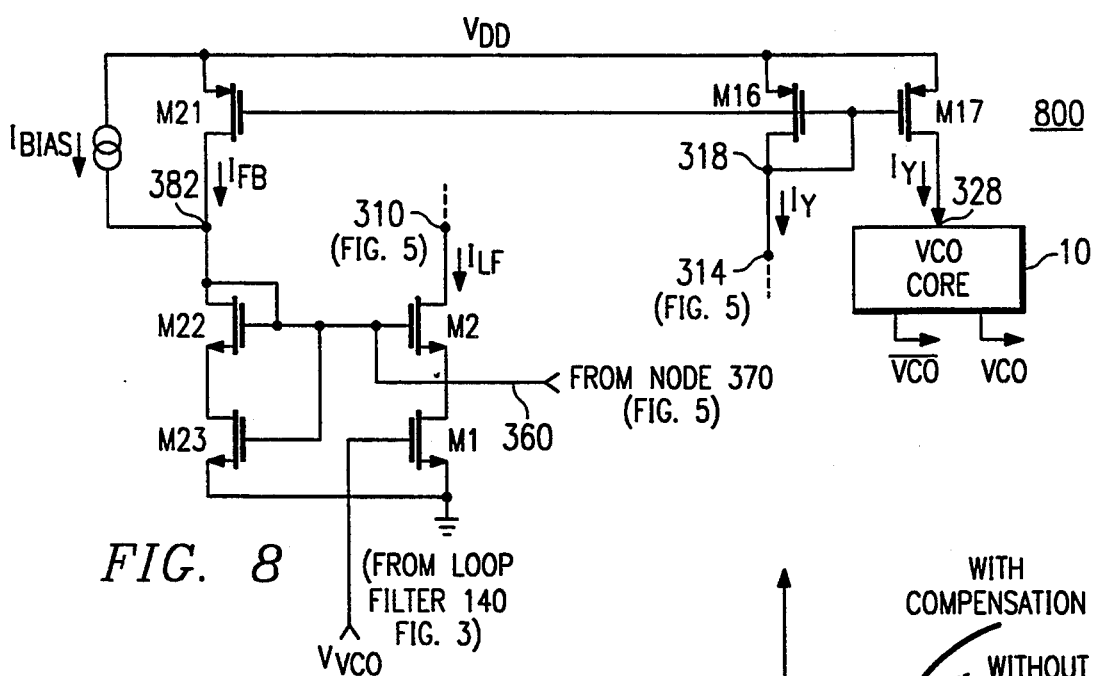
FIG. 8 illustrates an electrical schematic circuit diagram of a third embodiment of a VCO circuit according to the teachings of the present invention.

FIG. 8 illustrates a third embodiment of the present invention. Essentially, gain-compensation circuit 800 of FIG. 8 may be incorporated directly into VCO circuit 300 of FIG. 5. The source of transistor M21 is connected to $V_{DD}$, and the gate of M21 is connected to the gate of transistor M16. The drain of M21 is connected to node 382. A terminal of bias current source, $I_{bias}$, is connected to $V_{DD}$, and the opposite terminal of the bias current source is connected to node 382. Node 382 is connected to the drain and gate of transistor M22, and also to the gates of M2 and M23. The source of transistor M22 is connected to the drain of transistor M23, and the source of M23 is connected to circuit ground.

Figure 9:
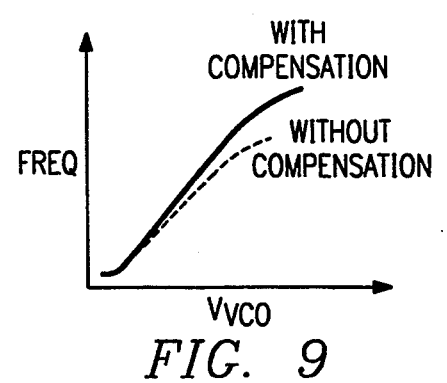
FIG. 9 illustrates representative gain curves for a gain-compensated VCO circuit according to the teachings of the present invention and a VCO circuit without gain compensation.

The gain compensation circuit shown in FIG. 8, may operate to linearize the gain curve of VCO circuit 300 for higher control voltage levels. Essentially, the control current, $I_{LF}$, may be increased as the control voltage, $V_{VCO}$, nears the high end of the control voltage range. Specifically, currents $I_{FB}$ and $I_{bias}$ are fed back to node 328, which maintains transistors M1, M11 and M13 in triode operation. At the higher control voltage levels (i.e., higher values of $V_{VCO}$), the correspondingly higher current levels, which may be fed back to node 328, supply higher voltage potentials to the drains of M1, M11 and M13. The higher drain potentials causes these transistors to conduct at a higher rate, which functions to increase current $I_{LF}$, and therefore, $I_Y$, non-linearly for the higher values of $V_{VCO}$. Consequently, in accordance with the present invention, the usable range of VCO circuit 300 in FIG. 5, may be extended by the circuit shown in FIG. 8. FIG. 9 illustrates advantages of the circuit shown in FIG. 8, by showing representative gain curves for VCO circuit 300 of FIG. 5, both with and without the gain compensation circuitry of FIG. 8.

Although the present invention and its advantages have been described in detail, it should be understood that various changes, substitutions and alterations can be made herein without departing from the spirit and scope of the invention as defined by the appended claims.

What is claimed is:

1. A programmable voltage-controlled oscillator, comprising:
   a first circuit operable to generate a signal at a predetermined frequency responsive to a drive current;
   a second circuit connected to an input of said programmable voltage-controlled oscillator and operable to transform an input control voltage to a corresponding control current and a fraction of a supply voltage for said programmable voltage-controlled oscillator to a corresponding fraction of a supply current, said second circuit further operable to subtract said fraction of a supply current from said control current to generate said drive current; and
   a gain compensation circuit coupled to said second circuit and operable to increase said drive current at a higher rate than a rate of increase of said input control voltage and thereby extend the effective range of said programmable voltage-controlled oscillator.

2. A programmable voltage-controlled oscillator, comprising:
   a first circuit operable to generate a signal at a predetermined frequency responsive to a drive current, said first circuit fabricated using an NMOS process;
   a second circuit connected to an input of said programmable voltage-controlled oscillator and operable to transform an input control voltage to a corresponding control current and a fraction of a supply voltage for said programmable voltage-controlled oscillator to a corresponding fraction of a supply current, said second circuit further operable to subtract said fraction of a supply current from said control current to generate said drive current; and
   a process compensation circuit coupled to said second circuit and operable to generate an n-channel current proportional to the strength of said NMOS process, said process compensation circuit further operable to subtract said n-channel current from said control current to generate said drive current.

3. A programmable voltage-controlled oscillator for use in a phase-locked loop, comprising:
   a first circuit operable to generate a signal at a predetermined frequency responsive to a drive current, an output of said first circuit connected to an output of said phase-locked loop and to a first input of a loop divider circuit of said phase-locked loop, said loop divider circuit responsive to a loop divider signal; and
   a second circuit connected to an output of a loop filter circuit of said phase-locked loop and to a second input of said loop divider circuit, said second circuit responsive to said loop divider signal and operable to transform a control voltage output from said loop filter circuit to a corresponding control current and a fraction of a supply voltage for said programmable voltage-controlled oscillator to a corresponding fraction of a supply current, said second circuit further operable to subtract said fraction of a supply current from said control current to generate said drive current.

4. The programmable voltage-controlled oscillator of claim 3, wherein said fraction is equal to one-half.

5. The programmable voltage-controlled oscillator of claim 3, wherein said phase-locked loop and said first and second circuits are fabricated in a single integrated circuit.

6. A method of operating a programmable voltage-controlled oscillator, comprising the steps of:
   generating a signal at a predetermined frequency responsive to a drive current;
   transforming an input control voltage for said programmable voltage-controlled oscillator to a corresponding control current;
   transforming a fraction of a supply voltage for said programmable voltage-controlled oscillator to a corresponding fraction of a supply current;
   subtracting said fraction of a supply current from said control current to generate said drive current; and
   increasing said drive current at a higher rate than a rate of increase of said input control voltage.

* * * * *